(12) United States Patent
Ding et al.

(10) Patent No.: US 10,778,104 B2
(45) Date of Patent: Sep. 15, 2020

(54) EFFICIENT ELECTRICITY CONVERSION FOR HARVESTING ENERGY FROM LOW VOLTAGE SOURCES

(71) Applicant: NATIONAL RESEARCH COUNCIL OF CANADA, Ottawa (CA)

(72) Inventors: Heping Ding, Ottawa (CA); Ryan Griffin, Ottawa (CA)

(73) Assignee: NATIONAL RESEARCH COUNCIL OF CANADA, Ottawa (CA)

( * ) Notice: Subject to any disclaimer, the term of this patent is extended or adjusted under 35 U.S.C. 154(b) by 0 days.

(21) Appl. No.: 16/131,650

(22) Filed: Sep. 14, 2018

(65) Prior Publication Data

US 2020/0091825 A1    Mar. 19, 2020

(51) Int. Cl.
*H02M 3/335* (2006.01)
*H01L 35/02* (2006.01)

(52) U.S. Cl.
CPC ........ *H02M 3/33523* (2013.01); *H01L 35/02* (2013.01)

(58) Field of Classification Search
CPC ................................................. H02M 3/33523
See application file for complete search history.

(56) References Cited

U.S. PATENT DOCUMENTS

| | | | |
|---|---|---|---|
| 7,714,546 B2 | 5/2010 | Kimura et al. | |
| 8,138,735 B2 | 3/2012 | Ivanov | |
| 9,444,354 B2 | 9/2016 | Woias | |
| 10,044,218 B2 | 8/2018 | Tiefnig | |
| 2003/0076314 A1* | 4/2003 | Kang | H04N 3/185 345/211 |
| 2005/0041437 A1* | 2/2005 | Chian | H02M 3/3381 363/16 |
| 2010/0119668 A1* | 5/2010 | Maupin | A47J 27/004 426/237 |
| 2010/0195360 A1* | 8/2010 | Salerno | H02M 1/10 363/126 |

(Continued)

FOREIGN PATENT DOCUMENTS

| | | |
|---|---|---|
| CN | 203967969 U | 11/2014 |
| CN | 204465342 U | 7/2015 |

OTHER PUBLICATIONS

Grgic, Dario et al., "Ultra-Low Input Voltage DC-DC Converter for Micro Energy Harvesting", PowerMEMS 2009, Washington DC, USA, Dec. 1-4, 2009, 4 pages.

(Continued)

*Primary Examiner* — Jue Zhang
*Assistant Examiner* — Trinh Q Dang

(57) ABSTRACT

A DC-DC converter and method are provided for converting a low voltage DC input to a higher voltage DC output. The DC-DC converter has an oscillator with a first relatively voltage sensitive and relatively low power transistor and a second relatively voltage insensitive and relatively high power transistor, the oscillator producing an AC signal from the low voltage DC input. The inclusion of the voltage sensitive transistor allows the oscillator to turn on at a relatively low voltage. The inclusion of the higher power transistor allows the oscillator to operate at a higher power once it turns on. The DC-DC converter can be used for converting energy harvested from low voltage sources.

23 Claims, 3 Drawing Sheets

(56) References Cited

U.S. PATENT DOCUMENTS

| | | | |
|---|---|---|---|
| 2014/0153290 A1* | 6/2014 | Li | H02M 3/3376 |
| | | | 363/17 |
| 2016/0218620 A1 | 7/2016 | Chen et al. | |
| 2017/0012193 A1 | 1/2017 | Jogia | |

OTHER PUBLICATIONS

EnOcean GmbH, ECT 310 Perpetuum, https://www.enocean.com/en/enocean_modules/ect-310-perpetuum/, 7 pages.
Linear Technology Corporation, LTC3108—Ultralow Voltage Step-Up Converter and Power Manager, http://www.linear.com/product/LTC3108, 13 pages.

* cited by examiner

EFFICIENT ELECTRICITY CONVERSION FOR HARVESTING ENERGY FROM LOW VOLTAGE SOURCES

FIELD

The application relates to systems and methods for converting energy harvested from low voltage sources.

BACKGROUND

Many sources of energy that can be harvested are in the form of electricity or can be readily converted to it. However in many practical situations, these electricity sources are either weak, with too high or too low a voltage, or with certain other issues. Consequently, they are rarely directly useful to low power electronic devices, for example in wireless sensor networks and Internet of Things (IoT) applications, where a relatively steady supply of a direct current (DC) voltage of a few volts may be required.

It would be advantageous to have systems and methods for efficiently and robustly converting low voltage DC electricity, such as from a thermo-electric generator (TEG), for example a thermopile, into a usable form, for example for use by wireless sensor networks and IoT applications.

An element in a system that turns low voltage DC electricity from a TEG into a usable form is a step-up DC-DC converter. A step-up DC-DC converter converts a low voltage DC input to a higher voltage DC output.

There are various step-up DC-DC converters for TEG energy harvesting available on the market. Many of these schemes rely on an oscillator to do the conversion.

Examples include those proposed in the following three references:
a. EnOcean GmbH, ECT 310 Perpetuum, https://www.enocean.com/en/enocean_modules/ect-310-perpetuum/.
b. Linear Technology Corporation, LTC3108—Ultralow Voltage Step-Up Converter and Power Manager, http://www.linear.com/product/LTC3108.
c. Dario Grgić, Tolgay Ungan, Miloš Kostić, and Leonhard M. Reindl, "Ultra-Low Input Voltage DC-DC Converter for Micro Energy Harvesting," PowerMEMS 2009, pp. 265268, Washington D.C., USA, Dec. 1-4, 2009.

Each of the three schemes introduced above works in a certain input range and at a relatively low efficiency. Their turn-on source conditions and efficiencies are summarized in Table 1 below, where VOC is the open-circuit voltage of the TEG device and RTEG is the internal resistance (also known as the source resistance) of the device. The turn-on source conditions for this example include turn-on voltage and RTEG. The turn-on voltage is the minimum voltage required from the source before the DC-DC converter starts to produce a DC output voltage with an absolute value greater than that of the input.

TABLE 1

Turn-on source conditions and efficiencies of existing schemes

|  | ECT310 by EnOcean | LTC3108 by Linear Technology | Dario Grgić et_al. |
| --- | --- | --- | --- |
| Turn-on source condition | VOC = 20 mV & RTEG = 2 Ω or VOC = 50 mV & RTEG = 50 Ω | VOC = 50 mV & RTEG = 20 Ω or VOC = 100 mV & RTEG = 50 Ω | VOC = 10 mV & RTEG = 50 Ω[1] |
| Efficiency | 30% | 20-40% | <18% |

Note that, for Scheme Dario Grgić et al., VOC at RTEG=50Ω is derived from information provided in the abstract of the third reference: Vcc=6 mV (closed-circuit input voltage) and input power of 490 nW.

SUMMARY

A DC-DC converter and method are provided for converting a low voltage DC input to a higher voltage DC output. The DC-DC converter has an oscillator with a first relatively voltage sensitive and relatively low power transistor and a second relatively voltage insensitive and relatively high power transistor, the oscillator producing an AC signal from the low voltage DC input. The inclusion of the voltage sensitive transistor allows the oscillator to turn on at a relatively low voltage. The inclusion of the higher power transistor allows the oscillator to operate at a higher power once it turns on. The DC-DC converter can be used for converting energy harvested from low voltage sources.

According to one aspect of the present invention, there is provided a DC-DC converter for converting a low voltage DC input to a higher voltage DC output, the DC-DC converter comprising: an oscillator comprising a first relatively voltage sensitive and relatively low power transistor and a second relatively voltage insensitive and relatively high power transistor, the oscillator producing an AC signal from the low voltage DC input; a transformer for converting the AC signal produced by the oscillator to a higher voltage AC signal; a voltage rectifier for converting the higher voltage AC signal to the higher voltage DC output; wherein first and second transistors of the oscillator are such that the oscillator is initially turned on when the low voltage DC input is sufficiently high to start the oscillator initially using only the first relatively high-sensitivity low power transistor, and the second transistor turns on when the voltage on a secondary side of the transformer exceeds a turn-on voltage of the second transistor.

Optionally, the second transistor has a relatively lower on-resistance than the first transistor.

Optionally, the DC-DC converter further comprises an adaptive clamping mechanism that ensures a suitable bias for the first transistor under practical source and load conditions.

Optionally, the adaptive clamping mechanism comprises a capacitor connected between the output of a secondary of the transformer and the gate of the first transistor, and a gate-source PN junction of the first transistor.

Optionally, the first transistor is a JFET device and the second transistor is a MOSFET device.

Optionally, a turns-ratio of the transformer is selected for a particular source and load combination.

Optionally, the transformer has an adjustable turns-ratio.

Optionally, the transformer has taps and a selector for selecting between a plurality of turns-ratios.

Optionally, the selector is one of: mechanical; electronic and operated manually; electronic and operated by an independent control module; electronic whose state is automatically determined based on the current source and load conditions.

Optionally, the voltage rectifier is a voltage doubling rectifier.

Optionally, the voltage doubling rectifier has a first stage formed of a first capacitor and the gate-source junction of the first transistor, and a second stage formed of a diode and a second capacitor.

Optionally, the voltage rectifier is a voltage doubling rectifier having a first stage formed of the capacitor of the adaptive clamping mechanism and the gate-source junction of the first transistor, and a second stage formed of a diode and another capacitor.

Optionally, the DC-DC converter further comprises an output isolation switch.

Optionally, the output isolation switch comprises a transistor for isolating the load from the remainder of the DC-DC converter when there are harsh load conditions causing output terminals of the DC-DC converter to be either shorted or driven, and a resistor for allowing a leakage current following removal of the harsh load conditions such that the first transistor can start up.

Optionally, the DC-DC converter further comprises an output voltage limiter.

According to another aspect of the present invention, there is provided a power supply comprising: a low voltage source; the step-up converter as described herein.

Optionally, the low voltage source is a thermo-electric generator.

According to another aspect of the present invention, there is provided a method of converting a low voltage DC input to a higher voltage DC output, the method comprising: producing an AC signal from the low voltage DC input using an oscillator comprising a first relatively voltage sensitive and relatively low power transistor and a second relatively voltage insensitive and relatively high power transistor, by starting up oscillation of the oscillator when the low voltage DC input is sufficiently high to start the oscillator initially using only the first relatively high-sensitivity low power transistor, and turning on the second transistor when the voltage on a secondary side of the transformer exceeds the turn-on voltage of the second transistor; converting the AC signal produced by the oscillator to a higher voltage AC signal with a transformer; rectifying the higher voltage AC signal to produce the higher voltage DC output.

Optionally, the method further comprises performing adaptive clamping to ensure a suitable bias for the first transistor under practical source and load conditions.

Optionally, the method further comprises selecting a turns-ratio of the transformer for a particular source and load combination.

Optionally, selecting a turns-ratio of the transformer comprises one of: mechanically selecting one of a plurality of possible turns-ratios; electronically selecting one of a plurality of possible turns-ratios based on manual input; electronically selecting one of a plurality of possible turns-ratios operated by an independent control module; electronically selecting one of a plurality of possible turns-ratios automatically determined based on the current source and load conditions.

Optionally, the second transistor has a relatively lower on-resistance than the first transistor.

BRIEF DESCRIPTION OF THE DRAWINGS

Embodiments of the disclosure will now be described with reference to the attached drawings in which.

DETAILED DESCRIPTION

It would be desirable to have a DC-DC converter design with the following properties:
turn-on VOC that is less than about 25 mV at a source resistance of about 50 Ω;
a maximum efficiency that is higher than 40%; and
features the ability to choose different trade-offs between the turn-on voltage and the output driving capability.

These properties cannot be simultaneously realized by any of the three above-referenced schemes for reasons detailed below.

To ensure the oscillations start with a weak input power—meaning low source VOC and/or high RTEG, the driver in the oscillator should be able to provide a large gain, but not necessarily a big driving power. On the other hand, once the oscillation has been established and stable, a large driving power is needed to achieve the needed power throughput and a high efficiency of the overall converter.

The second referenced scheme uses a proprietary depletion-mode MOSFET as the driver. With a claimed minimum RDS(on) of only 0.5Ω, it is capable of providing a large power throughput. RDS(on) of a FET (MOSFET or JFET) is defined as the resistance between Drain and Source terminals at a certain $V_{GS}$, being the voltage across Gate and Source terminals. However, the transistor's "common source trans-conductance" gain around VGS=0 V, namely $g_m$ and also known as |yf$_s$|, is only around 10 m℧ as per Applicant's measurement. $g_m$ of a FET (MOSFET or JFET) is defined as $g_m = \Delta I_{DS}/\Delta V_{GS}$ i.e., ratio of the resultant output current increment to the input voltage increment. As a result of the low $g_m$ of the MOSFET, this scheme needs a relatively high turn-on power.

In contrast, the third referenced scheme adopts a high-gain JFET (BF862) as the driver, with a typical $g_m$ of 45 m℧; therefore, the third referenced scheme can start on a very weak input power. However, this transistor's minimum RDS(on), at VGS=0 V, is about 30Ω which is much larger than that of the transistor used in the second referenced scheme.

In general, it is difficult to find a driving transistor with a $g_m$ high enough and at the same time an RDS(on) low enough to deliver the mentioned properties, if one even exists.

In accordance with an embodiment of the invention, a step-up DC-DC converter is provided. In some specific implementations, which may depend for example on specific component choices and the inclusion of optional features, the provided DC-DC converter meets the above requirements and outperforms the three referenced existing schemes.

In a very specific realization, the DC-DC converter includes a transformer set or setable at a turns-ratio of 1:100, and the provided DC-DC converter can reliably start at VOC=22.8 mV and RTEG=50Ω, and can achieve a maximum efficiency of about 44%.

Figure 1:
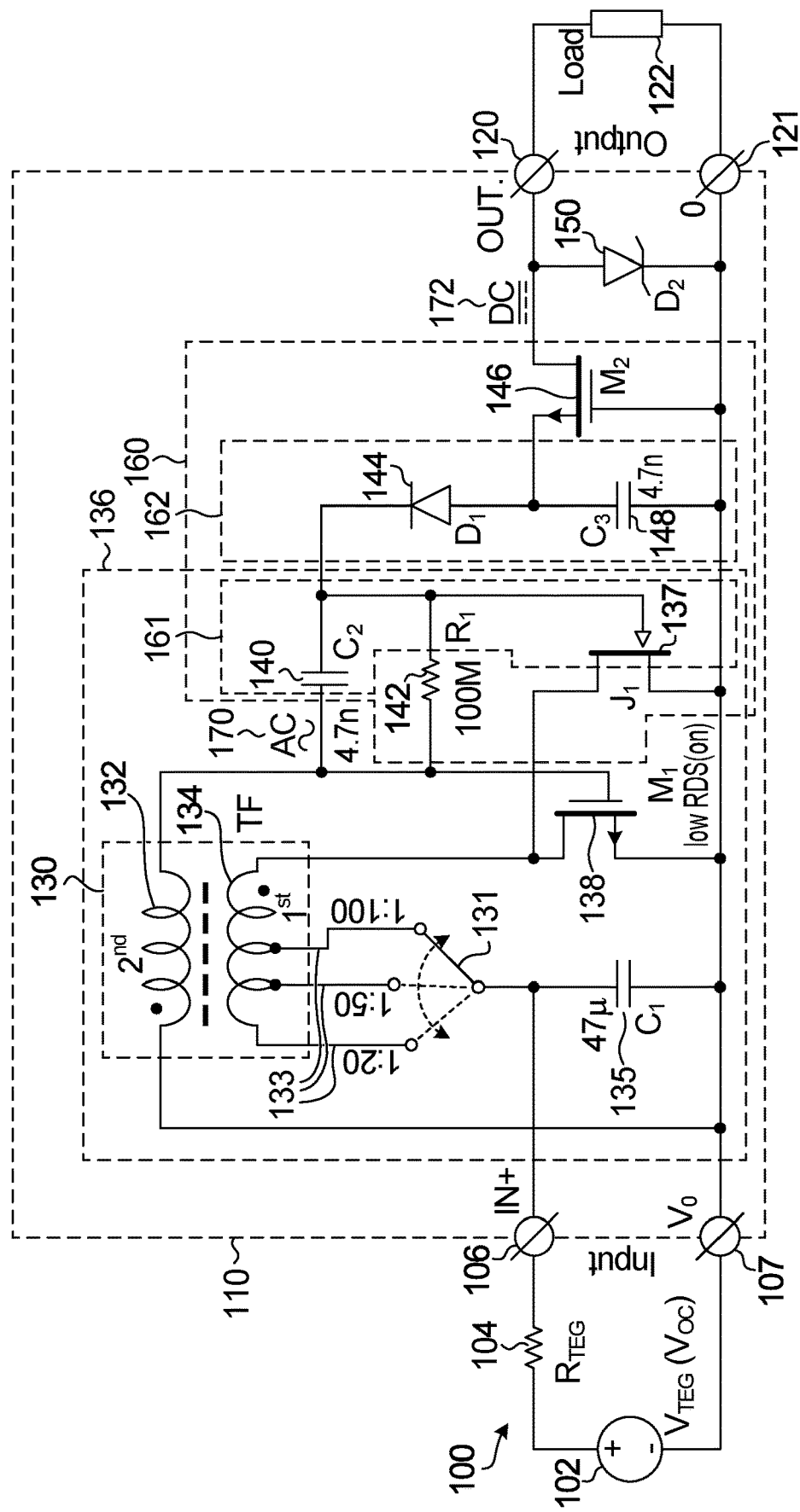
FIG. 1 is a circuit diagram of a DC-DC converter provided by an embodiment of the invention.

Referring now to FIG. 1, shown is circuit diagram of a power supply and load provided by an embodiment of the invention. In FIG. 1, a low voltage source is generally indicated at 100, which is connected via positive and negative input terminals 106,107 to the provided step-up converter circuit which is generally indicated at 110, which in turn is connected via positive and negative output terminals 120,121 to a load 122. The low voltage source 100 and the DC-DC converter 110 together form the power supply that powers the load 122.

The low voltage source 100 is modelled as a voltage source 102 that produces an input voltage VTEG on input terminal 106 relative to V0 on input terminal 107, and an input resistance RTEG 104.

The schematic of the step-up DC-DC converter 110 will be described in detail followed by a description of its functionality. A capacitor C1 135 is connected across the input terminals 106,107 to reduce the impact of the fluctuating load current and to suppress potential interference. Shown is a transformer 130 having a primary winding 134 and a secondary winding 132. The polarity configuration of the transformer windings is indicated by the phasing dots. In the illustrated example, the primary winding 134 has a selectable number of turns 133 such that the turns ratio between the primary and the secondary windings 134,132 is adjustable by a selector 131. In some embodiments, a transformer with a primary winding having a fixed number of turns is employed.

One terminal of the primary winding 134 is connected to input terminal 106 and the other terminal of primary winding 134 is connected to the drains of two transistors of a dual-transistor oscillator 136, the two transistors including a low power startup transistor J1 137, and a higher power transistor M1 138. One terminal of the secondary winding 132 is connected to V0, and the other is connected to gate of transistor M1 138 and to gate of transistor J1 137 via capacitor C2 140 connected in parallel with resistor R1 142.

The output of the parallel circuit formed by C2 140 and R1 142 is connected to the cathode of a diode D1 144. The anode of D1 144 is connected to the source of transistor M2. The anode of D1 144 is also connected via a capacitor C3 to V0. The gate of transistor M2 146 is connected to V0, and drain of transistor M2 146 is connected to negative output terminal 120. Finally, an optional Zener diode D2 150 is shown connected between drain of transistor M2 and V0, equivalently across the output terminals 120,121.

In the embodiment illustrated, the dual-transistor oscillator 136 includes the two transistors M1 and J1, and also the transformer, C1, C2 and R1. However it should be understood different implementations are possible, so long as the transistor oscillator includes two transistors, one of which has a low turn-on voltage and low power, and the other of which has relatively high turn-on voltage and high power.

Example component values and types are indicated in FIG. 1. It should be clearly understood that these are for the purpose of example only. The provided circuit is suitable to transform voltages from a TEG source, typically in the 10 to 20 mV range, to a higher voltage suitable for portable electronics, for example 2-5 V. The example component values and types are:

C1 47 µF; for example ceramic, thin film, polyester, or electrolytic

Transformer 134,132 has turns ratios 133 selectable between 1:20, 1:50 and 1:100 by a selector 131. In a specific implementation, the transformer has characteristics similar to that of Coilcraft's LPR6235-253PMR, LPR6235-123QMR or LPR6235-752SMR.

M1: NTUD 3170NZ
J1: BF862 or 2SK932
C2: 4.7 nF, for example ceramic
R1: 100 MΩ
D1: 1N649-1 or similar. In another specific example, the gate source junction of another JFET such as 2SK932 is used for D1;
C3: 4.7 nF ceramic
M2: NTUD 3170NZ
D2: ESD9R3.3S The illustrated step-up converter circuit includes a number of specific features the functionality of which is detailed further below. For brevity, in the description that follows components will be identified by their component names only.

a. a dual-transistor oscillator 136 formed of at least transistors J1 and M1
b. an adaptive clamping bias mechanism (C2 and J1) for transistor J1
c. an adjustable turns-ratio transformer
d. a voltage doubling rectifier (C2, J1, D1, and C3)
e. an output isolation switch (M2 and R1),
f. an output voltage limiter (D2).

Other embodiments are possible that do not include all these features. For example, in some embodiments, the output voltage limiter is included if the output is to be limited to around 6 V; otherwise, the built-in protection diodes between gate and source of M2 can also provide an overvoltage protection though at a slightly higher potential, of about 8 V. As another specific example, there is no need for resistor R1 in some implementations, for example if the load is not capacitive.

Dual-Transistor Oscillator

Since transformers work on AC voltages, an oscillator is provided to convert a DC input voltage to an AC voltage. While existing schemes use a single transistor in the oscillator, the provided circuit features a dual-transistor oscillator 136 having start-up transistor J1 for low power start-up and power transistor M1 for high power throughput.

The dual transistor oscillator addresses the difficulty of finding a single transistor that has a high gain and a low RDS(on) simultaneously.

J1 is a JFET device with a high sensitivity, meaning $g_m$ or common source trans-conductance being high compared to that of M1, to ensure a reliable start-up of the oscillation even if the input power is weak. In this case, M1 may have little effect; M1 has comparatively low sensitivity such that it stays off as long as the peak of the induced voltage at the secondary side of the transformer is lower than its VGS(th), for example of about 0.7 V. VGS(th) of a MOSFET such as M1 is a threshold voltage defined as the VGS at which the transistor starts to conduct. Note that in the illustrated example, M1 is an enhancement-mode MOSFET. Therefore when the input power is weak, the converter operates on J1 only and is not capable of providing a large power throughput, but there is not much input power to be passed on anyway.

As the input power increases, so does the induced voltage at the secondary side of the transformer. When exceeding VGS(th) of M1 (~0.7 V), this voltage turns on the latter, whose RDS(on) (about 1-3Ω for the specific component illustrated) is much smaller than J1's. Therefore, the converter with both J1 and M1 in operation is capable of providing a larger power throughput.

If for whatever reason the input power drops low again, so will the induced voltage at the transformer's secondary side. This will automatically turn M1 off.

Adaptive Clamping Mechanism

An adaptive clamping mechanism is provided to ensure a suitable bias for the start-up transistor J1 under practical source and load conditions.

It is beneficial to bias J1 so that it operates around the vicinity of its VGS(off), for example of around −0.8 V for transistor BF862 as J1. VGS(off) of a JFET such as J1 is the VGS at which the transistor is said to be cutoff. And, its VGS should not go positive normally.

In the described embodiment, an adaptive clamping mechanism 161 consisting of C2 and the Gate-Source PN junction of J1 keeps J1 suitably biased all the time. The voltage across C2 follows the peak positive voltage of the transformer's secondary side and equals the latter minus the forward voltage drop of J1's Gate-Source PN junction. When the AC voltage of transformer's secondary side increases for whatever reason, C2 is charged to a higher voltage through the Gate-Source PN junction of J1. This keeps the PN junction reverse biased most of the time. On the other hand, if the AC voltage of the transformer's secondary side decreases, C2 is not charged because the PN junction of J1 stays reverse biased. Then, C2 discharges through D1 to the load and to a less extent through R1, until the voltage across C2 is low enough so that the aforementioned charging process resumes.

Adjustable Turns-Ratio Transformer

The transformer 130 transforms the input AC voltage to a higher AC voltage 170 with less current such that when the higher AC voltage 170 is converted back to DC, a step-up in voltage has been achieved. The inclusion of a transformer with an adjustable turns-ratio 133 enables optimization or improvement of output power and efficiency. For different source and load conditions, the optimal turns-ratio of the transformer, at which the step-up DC-DC converter can deliver a maximum possible power at high efficiency, is different. In general, a lower turns-ratio is preferred for higher input voltages and heavier loads, and vice versa.

Figure 3:
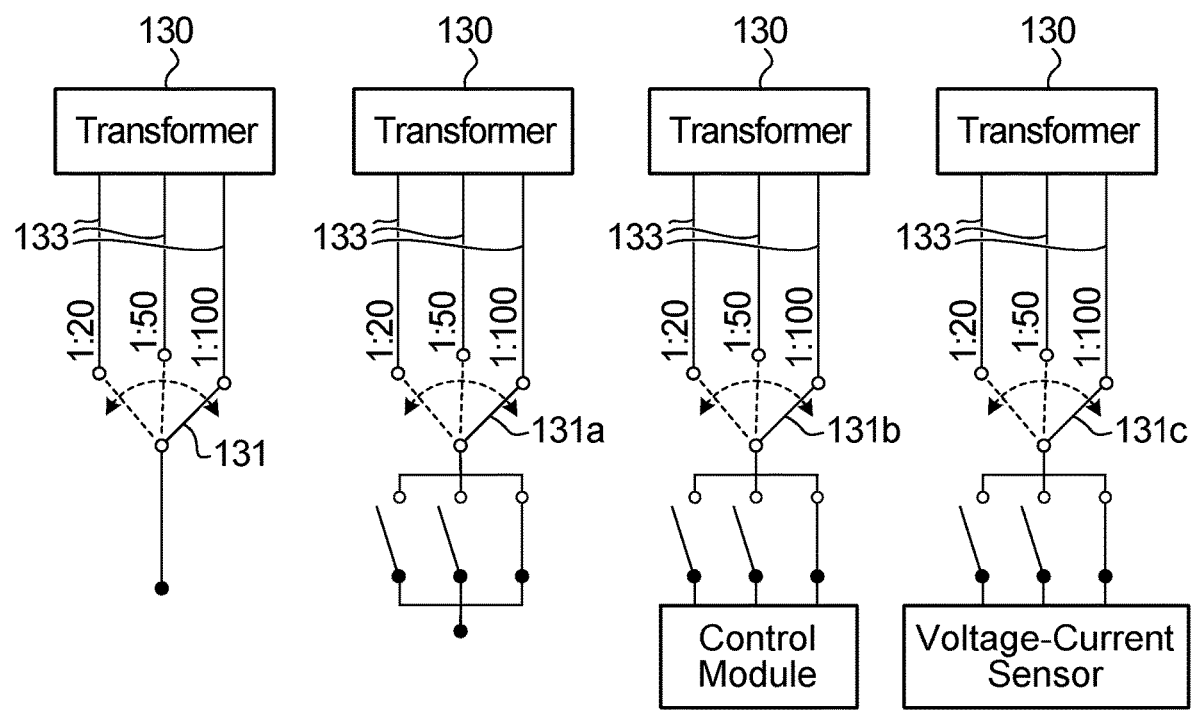
FIG. 3 is a diagram of example implementations of the adjustable turns-ratio selector.

In some embodiments, the transformer with adjustable turns-ratio is implemented using one of:
- providing transformers of different fixed turns-ratios for each specific application to choose from and install in the target system; or
- incorporating a transformer with taps and a selector 131, as shown in FIG. 1. As shown in FIG. 3, this selector can be, in an ascending order of complexity,
  - simply mechanical 131,
  - electronic and operated manually 131*a*,
  - electronic and operated by an independent control module 131*b*, or
  - electronic whose state is automatically determined based on the current source and load conditions 131*c*.

FIG. 3 further shows the implementations of electronic switches to control the selector of the adjustable turns-ratio. These electronic switches can be operated manually 131*a*, operated by an independent control module 131*b*, or automatically operated by voltage and current sensors based on the current source and load conditions 131*c*.

For turns-ratios of 1:20 and 1:50, the source will have to provide more power than in the case with a 1:100 turns-ratio transformer in order for the step-up DC-DC converter to turn on. For example, the turn-on VOC of the circuit of FIG. 1 with source resistance RTEG=50Ω is 22.8, 37.6, and 85.6 mV for transformer's turns-ratios of 1:100, 1:50, and 1:20, respectively. If the source resistance RTEG is reduced to 5Ω, these figures decrease to 10.0, 17.2, and 38.5 mV, respectively.

Voltage Doubling Rectifier

The output AC voltage 170 of the transformer is converted back to DC in a voltage doubling rectifier 160. In the illustrated example, this is formed of C2, J1, D1, and C3. The output DC voltage 172 is twice the peak AC oscillation voltage less the forward voltage drops of D1 and the Gate-Source PN junction of J1. Advantageously, in addition to providing the adaptive clamping function discussed above, C2 and the Gate-Source PN junction of J1 also acts as the first stage 161 of the voltage-doubling rectifier. The second stage 162 consists of D1 and C3. This multiplexing strategy not only reduces component count but also reduces overhead power that would be consumed if a separate circuit were implemented to fulfil the function of the rectifier's first stage 161.

In other embodiments, a different rectifier, that is not necessarily a doubling rectifier, is used.

Output Isolation Switch

To be practical, a step-up DC-DC converter should be robust enough, i.e., it should be able to start and maintain oscillation even if the output is shorted or driven. This is the case when, for example, the converter is used to charge a large capacitive load, such as a supercapacitor. This is expected to happen very often because such energy harvesting devices are most probably used to provide power to wireless sensors in a building and these sensors sleep most of the time and wake up intermittently to do the measurement and transmission before going back to sleep again. Given the low duty-cycle and impulsive nature of the load, a buffering supercapacitor is a perfect choice in this context. When a supercapacitor is connected to a step-up DC-DC converter, the latter's output can be virtually shorted when the capacitor has no or little charge in it, or driven when the input power disappears or goes low while the capacitor already has some charge in it.

As a result, there is a harsh load/output condition, for example when the output is shorted or driven, a step-up DC-DC converter without an output isolation switch will not start or maintain oscillation normally. And, the oscillation may not resume after the harsh output condition is removed.

In the described embodiment, a simple output isolation switch is provided to effectively isolate the converter from harsh load conditions, so that the device can start and operate normally even if the output is shorted or driven. The switch is composed of transistor M2 and resistor R1. With a weak input power or during start up, the "pre-output" voltage, across C3, is lower than the VGS(th) of M2, M2 being an enhancement-mode MOSFET. Therefore, M2 is off, isolating the converter from the load. This assures a normal start up whatever the load condition is. If the load becomes shorted or too heavy during operation, the significant amount of current it draws drags down the output voltage to below the VGS(th) of M2. As a result, the latter will turn off, preventing the oscillation from being ceased. Another scenario is that, when the input power disappears and the load supercapacitor has already accumulated some significant voltage, this voltage can, through the forward-biased built-in diode in M2 (even if M2 is off) and the reverse leakage of D1, charge C2 to a high enough voltage that keeps J1 off when the input power resumes. This prevents the oscillation from starting. This problem is resolved by introducing a very small leakage device R1. This prevents the voltage across C2 from going too high, and the power loss it incurs is proven to be negligibly small.

Output Voltage Limiter (D2)

Some embodiments features an output voltage limiter. The circuit of FIG. 1 includes Zener diode D2 150 which serves this purpose. For whatever reason if the load voltage exceeds an allowable value, an appropriately chosen D2 150 will conduct and bring down the load voltage. As a result, the load voltage will always be less than the Zener breakdown value of D2 150.

Figure 2:
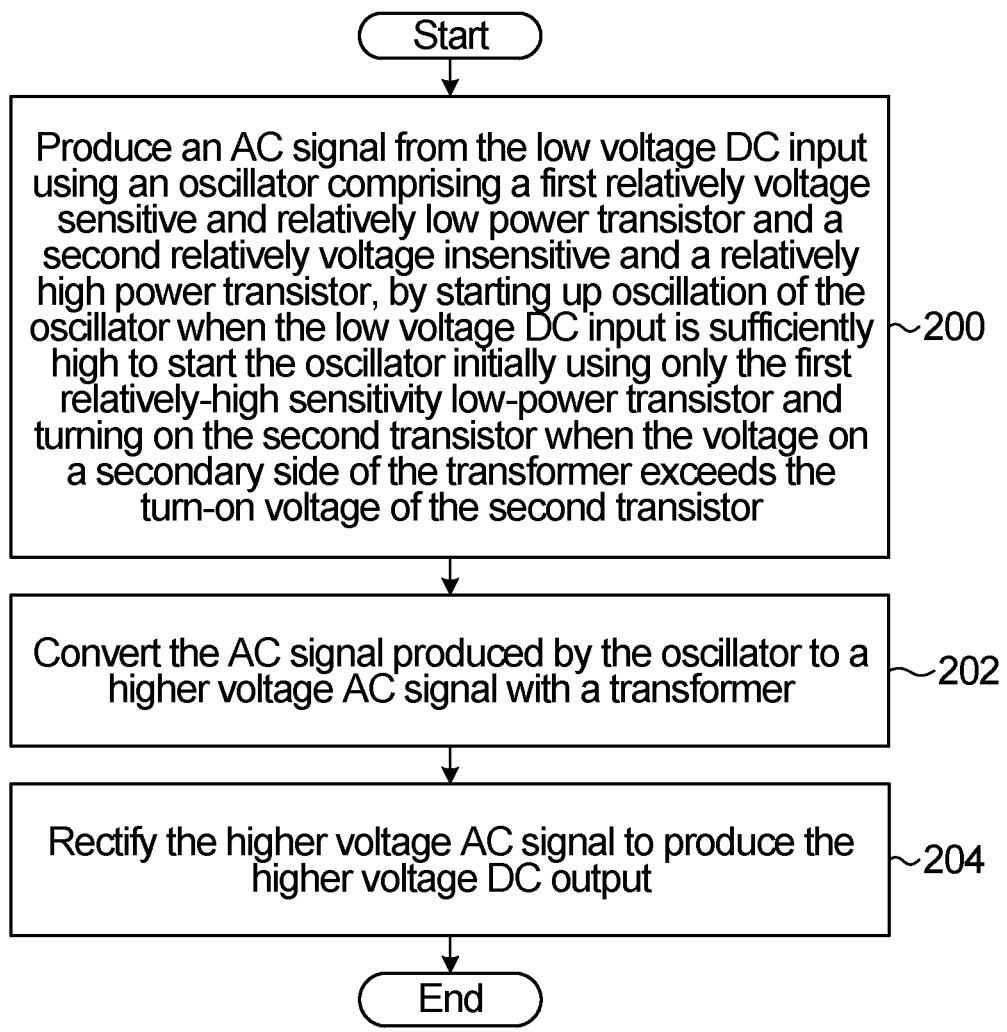
FIG. 2 is a flowchart of a method of performing DC-DC conversion provided by an embodiment of the invention.

Referring now to FIG. 2, shown is a flowchart of a method of converting a low voltage DC input to a higher voltage DC output provided by an embodiment of the invention. The method begins in block 200 with producing an AC signal from the low voltage DC input using an oscillator comprising a first relatively voltage sensitive and relatively low power transistor and a second relatively voltage insensitive and relatively high power transistor, by starting up oscillation of the oscillator when the low voltage DC input is sufficiently high to start the oscillator initially using only the first relatively high-sensitivity low power transistor, and turning on the second transistor when the voltage on a secondary side of the transformer exceeds the turn-on voltage of the second transistor. The method continues in block 202 with converting the AC signal produced by the oscillator to a higher voltage AC signal with a transformer. The method continues in block 204 with rectifying the higher voltage AC signal to produce the higher voltage DC output.

Note that any combination of the features described in the context of the embodiment of FIG. 1 can also be included as method steps added to the method of FIG. 2. For example, in some embodiments, the method further involves performing adaptive clamping to ensure a suitable bias for the first transistor under practical source and load conditions.

In some embodiments, the method also includes selecting a turns-ratio of the transformer for a particular source and load combination.

Selecting a turns-ratio of the transformer may be performed, for example, using one of:

mechanically selecting one of a plurality of possible turns-ratios;

electronically selecting one of a plurality of possible turns-ratios based on manual input;

electronically selecting one of a plurality of possible turns-ratios operated by an independent control module;

electronically selecting one of a plurality of possible turns-ratios automatically determined based on the current source and load conditions.

Numerous modifications and variations of the present disclosure are possible in light of the above teachings. It is therefore to be understood that within the scope of the appended claims, the disclosure may be practiced otherwise than as specifically described herein.

The invention claimed is:

1. A DC-DC converter for converting a low voltage DC input to a higher voltage DC output, the DC-DC converter comprising:
an oscillator comprising a first relatively voltage sensitive and relatively low power transistor and a second relatively voltage insensitive and relatively high power transistor, the oscillator producing an AC signal from the low voltage DC input;
a transformer for converting the AC signal produced by the oscillator to a higher voltage AC signal;
a voltage doubling full wave rectifier for converting the higher voltage AC signal to the higher voltage DC output;
wherein the first relatively voltage sensitive and relatively low power transistor and the second relatively voltage insensitive and relatively high power transistor of the oscillator are such that the oscillator is initially turned on when the low voltage DC input is sufficiently high to start the oscillator initially using only the first relatively voltage sensitive and the relatively low power transistor, and the second relatively voltage insensitive and relatively high power transistor turns on when the voltage on a secondary side of the transformer exceeds the turn-on voltage of the second transistor; and
wherein the voltage doubling full wave rectifier has a first stage formed of a first capacitor and the gate-source junction of the first transistor, and a second stage formed of a diode and a second capacitor.

2. The DC-DC converter of claim 1, wherein the first relatively voltage and relatively low power transistor is a JFET device and the second relatively voltage insensitive and relatively high power transistor is a MOSFET device.

3. The DC-DC converter of claim 1 wherein the second relatively voltage sensitive and relatively high power transistor has a relatively lower on-resistance RDS(on) than the first relatively voltage sensitive and relatively low power transistor.

4. The DC-DC converter of claim 1 further comprising an adaptive clamping mechanism that ensures a suitable bias for the first relatively voltage sensitive and relatively low power transistor under practical source and load conditions.

5. The DC-DC converter of claim 1 wherein a turns-ratio of the transformer is selected for a particular source and load combination.

6. The DC-DC converter of claim 1 wherein the transformer has an adjustable turns-ratio.

7. The DC-DC converter of claim 1 further comprising an output isolation switch.

8. The DC-DC converter of claim 1 further comprising an output voltage limiter.

9. A power supply comprising:
a low voltage source;
the step-up converter of claim 1.

10. The DC-DC converter of claim 1 wherein:
the diode is connected between the first capacitor and the second capacitor, the diode connected to permit current flow in a direction from the second capacitor towards the first capacitor.

11. The DC-DC converter of claim 4 wherein the adaptive clamping mechanism comprises a capacitor connected between the output of a secondary of the transformer and the gate of the first relatively voltage sensitive and relatively lower power transistor, and a gate-source PN junction of the first relatively voltage sensitive and relatively lower power transistor.

12. The DC-DC converter of claim 6 wherein the transformer has taps and a selector for selecting between a plurality of turns-ratios.

13. The DC-DC converter of claim 7 wherein the output isolation switch comprises a transistor for isolating the load from the remainder of the DC-DC converter when there are harsh load conditions causing output terminals of the DC-DC converter to be either shorted or driven, and a resistor for allowing a leakage current following removal of the harsh load conditions such that the first transistor can start up.

14. The power supply of claim 9 wherein the low voltage source is a thermo-electric generator.

15. The DC-DC converter of claim 11 wherein the first capacitor is the capacitor of the adaptive clamping mechanism.

16. The DC-DC converter of claim 12 wherein the selector is one of:
mechanical;
electronic and operated manually;
electronic and operated by an independent control module;

electronic whose state is automatically determined based on the current source and load conditions.

17. The DC-DC converter of claim 15 wherein:
the diode is connected between the capacitor of the adaptive clamping mechanism and the another capacitor, the diode connected to permit current flow in a direction from the another capacitor towards the capacitor of the adaptive clamping mechanism.

18. A method of converting a low voltage DC input to a higher voltage DC output, the method comprising:
producing an AC signal from the low voltage DC input using an oscillator comprising a first relatively voltage sensitive and relatively low power transistor and a second relatively voltage insensitive and relatively high power transistor, by starting up oscillation of the oscillator when the low voltage DC input is sufficiently high to start the oscillator initially using only the first relatively voltage sensitive and relatively low power transistor, and turning on the second relatively voltage insensitive and relatively high power transistor when the voltage on a secondary side of the transformer exceeds the turn-on voltage of the second transistor;
converting the AC signal produced by the oscillator to a higher voltage AC signal with a transformer;
voltage doubling full wave rectifying the higher voltage AC signal to produce the higher voltage DC output using a voltage doubling full wave rectifier that has a first stage formed of a first capacitor and the gate-source junction of the first transistor, and a second stage formed of a diode and a second capacitor.

19. The method of claim 18, wherein the first transistor is a JFET device and the second transistor is a MOSFET device.

20. The method of claim 18 further comprising performing adaptive clamping to ensure a suitable bias for the first relatively voltage sensitive and relative low power transistor under practical source and load conditions.

21. The method of claim 18 further comprising selecting a turns-ratio of the transformer for a particular source and load combination.

22. The method of claim 18 wherein the second transistor has a relatively lower on-resistance RDS(on) than the first transistor.

23. The method of claim 21 wherein selecting a turns-ratio of the transformer comprises one of:
mechanically selecting one of a plurality of possible turns-ratios;
electronically selecting one of a plurality of possible turns-ratios based on manual input;
electronically selecting one of a plurality of possible turns-ratios operated by an independent control module;
electronically selecting one of a plurality of possible turns-ratios automatically determined based on the current source and load conditions.

* * * * *